United States Patent
Xiao et al.

(10) Patent No.: US 9,131,603 B2
(45) Date of Patent: Sep. 8, 2015

(54) SIGNAL LINE PAIRS ON A CIRCUIT BOARD WHICH ARE DISPLACED FROM EACH OTHER RELATIVE TO A CENTER LINE

(71) Applicant: INTEL CORPORATION, Santa Clara, CA (US)

(72) Inventors: Kai Xiao, University Place, WA (US); Jimmy Hsu, Taoyuan (TW); Yuan-Liang Li, Taipei (TW); Richard K. Kunze, Woodinville, WA (US)

(73) Assignee: Intel Corporation, Santa Clara, CA (US)

( * ) Notice: Subject to any disclaimer, the term of this patent is extended or adjusted under 35 U.S.C. 154(b) by 122 days.

(21) Appl. No.: 13/844,761

(22) Filed: Mar. 15, 2013

(65) Prior Publication Data
US 2014/0266490 A1 Sep. 18, 2014

(51) Int. Cl.
*H05K 1/02* (2006.01)
*H01P 3/08* (2006.01)
*H01P 11/00* (2006.01)

(52) U.S. Cl.
CPC ............... *H05K 1/0228* (2013.01); *H01P 3/08* (2013.01); *H01P 11/00* (2013.01); *H05K 1/0245* (2013.01); *H05K 1/0298* (2013.01); *H05K 2201/09236* (2013.01); *H05K 2201/09709* (2013.01); *Y10T 29/49155* (2015.01)

(58) Field of Classification Search
CPC .................................................. H05K 1/0245
USPC ................................................. 333/4, 5, 238
See application file for complete search history.

(56) References Cited

U.S. PATENT DOCUMENTS

| | | | |
|---|---|---|---|
| 6,058,256 A | 5/2000 | Mellen et al. | |
| 6,614,325 B1 * | 9/2003 | Kocin | 333/12 |
| 7,196,597 B2 * | 3/2007 | Saitou et al. | 333/204 |
| 2002/0050870 A1 * | 5/2002 | Koga | 333/1 |
| 2002/0057136 A1 | 5/2002 | Marketkar et al. | |
| 2009/0242244 A1 * | 10/2009 | Hsu et al. | 174/255 |

FOREIGN PATENT DOCUMENTS

EP 1037512 A1 9/2000

OTHER PUBLICATIONS

European Search Report for European Application No. 14160014.8, mailed on Mar. 19, 2015, 8 pages.

* cited by examiner

*Primary Examiner* — Benny Lee
(74) *Attorney, Agent, or Firm* — International IP Law Group, P.L.L.C.

(57) ABSTRACT

A signal line design is described herein. A circuit board may include a first signal line and a second signal line. The first signal line includes a pair of signal lines at a first depth of a section of a circuit board, wherein a centerline extends lengthwise between the pair of signal lines. The second signal line is disposed at a second depth of the circuit board. The second signal line includes a first segment that runs parallel to the first signal line at a first displacement from the center line. The second signal line includes a second segment that runs parallel to the first signal line on the other side of the center line at a second displacement distance from the center line.

25 Claims, 7 Drawing Sheets

100

301

400

SIGNAL LINE PAIRS ON A CIRCUIT BOARD WHICH ARE DISPLACED FROM EACH OTHER RELATIVE TO A CENTER LINE

TECHNICAL FIELD

This disclosure relates generally to techniques for reducing crosstalk between signal lines in a computing device. More specifically, the disclosure describes a technique for routing transmission lines such that crosstalk between the lines is reduced.

BACKGROUND

Modern computing devices continue to incorporate a growing number of components into smaller device chassis. As chassis volumes are decreased, the routing density of circuit boards increases, which results in corresponding increases in crosstalk noise between signal lines of the circuit board. Circuit boards of a computing device may include traces configured to carry signals from one component of a circuit board to another. A stripline refers to a conductive trace that is located between two planar conductive structures with a dielectric material completely surrounding the trace. As a result, stripline traces are routed internal to the board and are not exposed to the external environment. A dual stripline refers to two traces located between planar conductive structures with a dielectric material surrounding both traces. Dual-stripline designs are used in stacked circuit boards and are popular in computer systems, such as half-width server platforms, because they save circuit board cost by lowering the number of sections in the stack due to a higher density of signaling. Adjacent traces of a dual-stripline design are co-located in the same section, and generate crosstalk between the two traces. Crosstalk tends to reduce circuit board performance, which tends to limit the data rate at which circuit boards can successfully operate.

DETAILED DESCRIPTION OF THE INVENTION

The subject matter disclosed herein relates to signal lines configured to reduce crosstalk. More specifically, the subject matter disclosed herein relates to a dual-stripline routing wherein one signal line crosses over the other signal line enabling a reduction of crosstalk. The techniques disclosed herein provide significant increases in routing density of circuit boards by arranging signal lines disposed between two planes in a way that reduces crosstalk between the signal lines. Increasing the routing density enables stacked circuit boards to be manufactured having a relatively smaller amount of stacked sections.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Figure 1:
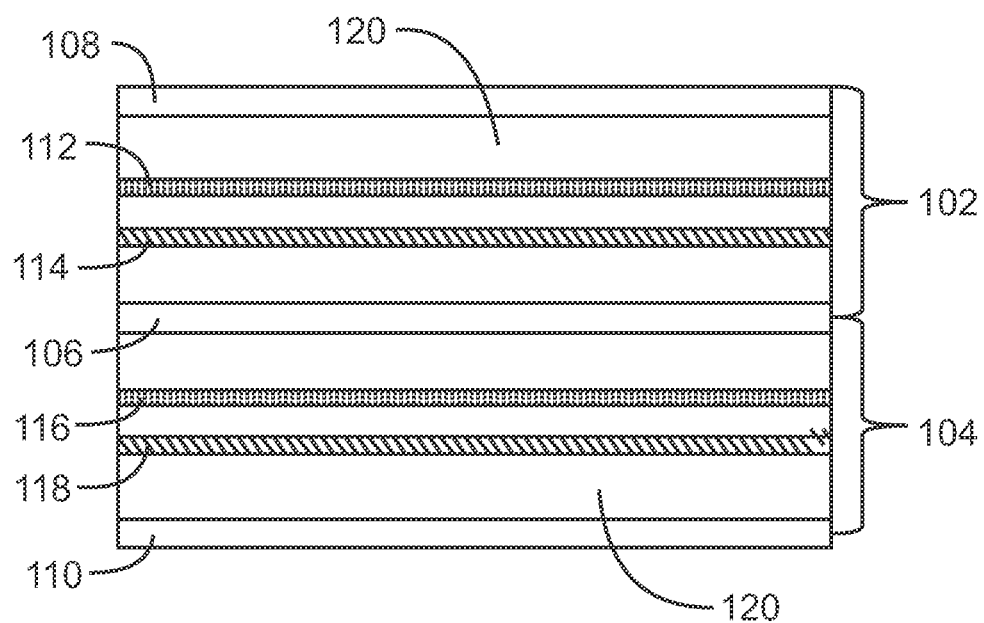
FIG. 1 is a block diagram illustrating a lengthwise side view of a stacked circuit board.

FIG. 1 is a block diagram illustrating a lengthwise side view of a stacked circuit board. The stacked circuit board 100 includes a first section indicated by the bracket 102, and a second section indicated by the bracket 104. The first section 102 and the second section 104 are separated by a conductive plane 106. The first section 102 includes a conductive plane 108. Likewise, the second section 104 includes a conductive plane 110. The conductive planes 106, 108, 110 are reference planes such as ground planes. The conductive planes 106, 108, 110 are reference planes to signal lines, such as the signal lines 112, 114, 116, 118. The signal lines 112, 114, 116, 118 are configured to communicate signals across the circuit board 100. The signal lines 112, 114, 116, 118 may be disposed in a dielectric material 120. The signal lines 112, 114, 116, 118 may be configured to enable communication between the first section 102 and the second section 104 through vias (not shown). Although not shown in FIG. 1, as seen from above the horizontal plane, the signal lines 112 may cross over the signal lines 114 in the horizontal plane. For example, the signal lines 112 can include a first segment that is disposed on a first side relative to a centerline of the signal line 114 and a second segment that is disposed on a second side relative to the centerline of the signal line 114. The disposition of the signal lines is described in more detail below.

Figure 2:
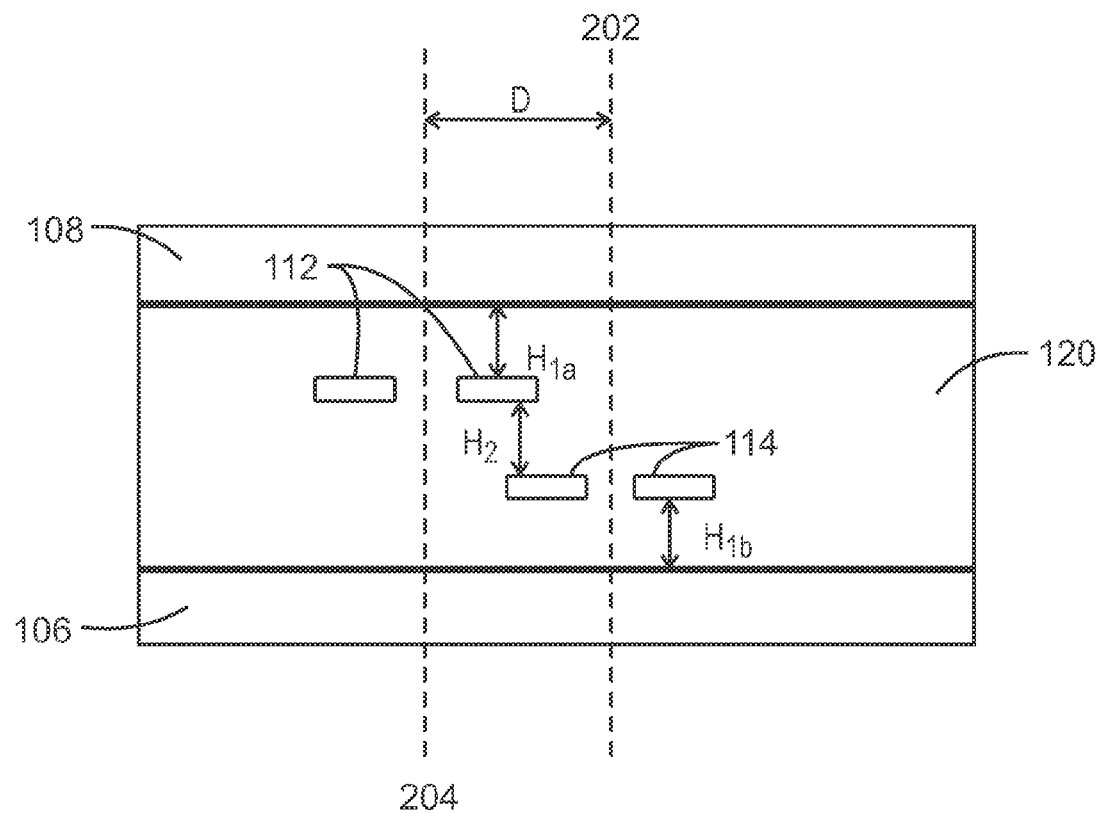
FIG. 2 is a block diagram illustrating an edge view of one section of the circuit board.

FIG. 2 is a block diagram illustrating an edge view of one section of the circuit board. The section may be the first section 102 of the circuit board 100 of FIG. 1, including the signal lines 112, 114 within the dielectric material 120, and sandwiched by the conductive planes 106, 108. The conductive planes 106, 108 are ground planes and may provide a reference to the signal lines 112, 114. As shown in FIG. 2, the signal lines 112, 114 may each include a pair of signal lines. In this embodiment, each of the signal lines 112, 114 is configured to communicate differential signals wherein one of the signal lines in each pair is configured to carry a signal having a positive polarity and the other signal line in each pair is configured to carry a signal having a negative polarity. The signal lines 112, 114 may be disposed at a depth within the dielectric material with respect to a respective ground plane 106, 108. For example, the pair of signal lines 112 may be disposed at a depth of $H_{1a}$ with respect to the ground plane 108. The pair of signal lines 114 may be disposed at a depth of $H_{1b}$ with respect to the ground plane 106. Each pair of signal lines 112, 114 may be disposed at a depth with respect to each other, as indicated by $H_2$ of FIG. 2. Each pair of signal lines 112, 114 may have a center point between the pair. For example, the signal pair 114 may have a center point coinciding with the dashed line 202 between the signal pair 114. Likewise, the signal pair 112 may have a center point coinciding with the dashed line 204 between the signal pair 112. The distance between the center points may be the distance "D," indicated in FIG. 2, between the dashed line 202 and the dashed line 204. The distance D between the center points may be referred to herein as "center-to-center displacement." The center-to-center displacement is configured to enable crosstalk reduction between the pair of signal lines 112 and 114. In other words, the signal lines 112 and the signal lines 114, may be displaced with respect to each other's center lines 202, 204, respectively. The reduction, as illustrated in FIG. 4, enables crosstalk reduction by displacing the signal lines 112, 114 laterally away from each other to reduce, and in some cases cancel, crosstalk between the signal lines 112 and 114. Further embodiments, such as the embodiment discussed in FIG. 3A or FIG. 3B, describe a first segment and a second segment on either side of a centerline of the signal line pair 114.

Figure 3A:
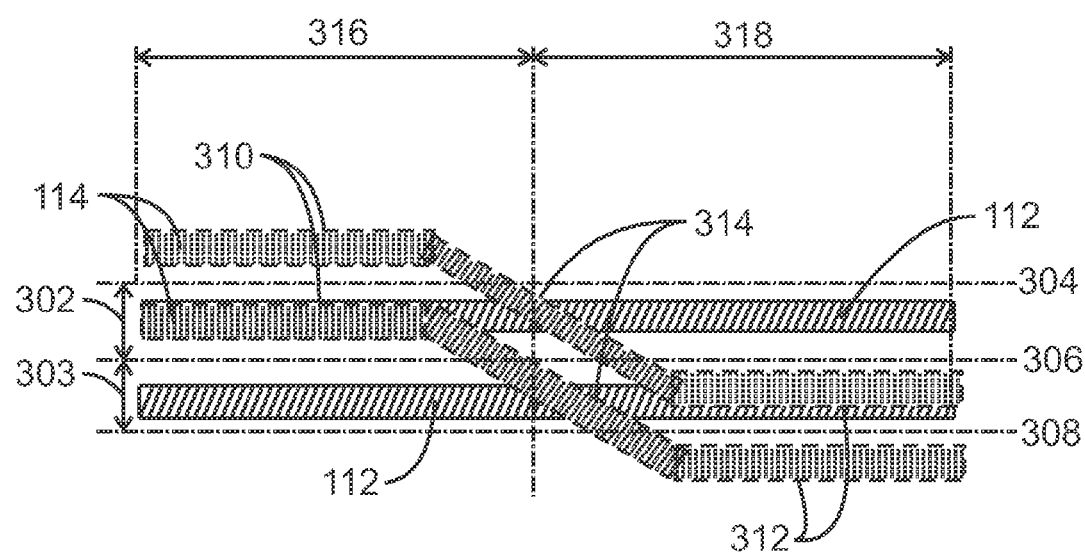
FIG. 3A is a diagram illustrating a top view of the circuit board and two signal line pairs.
Figure 4:
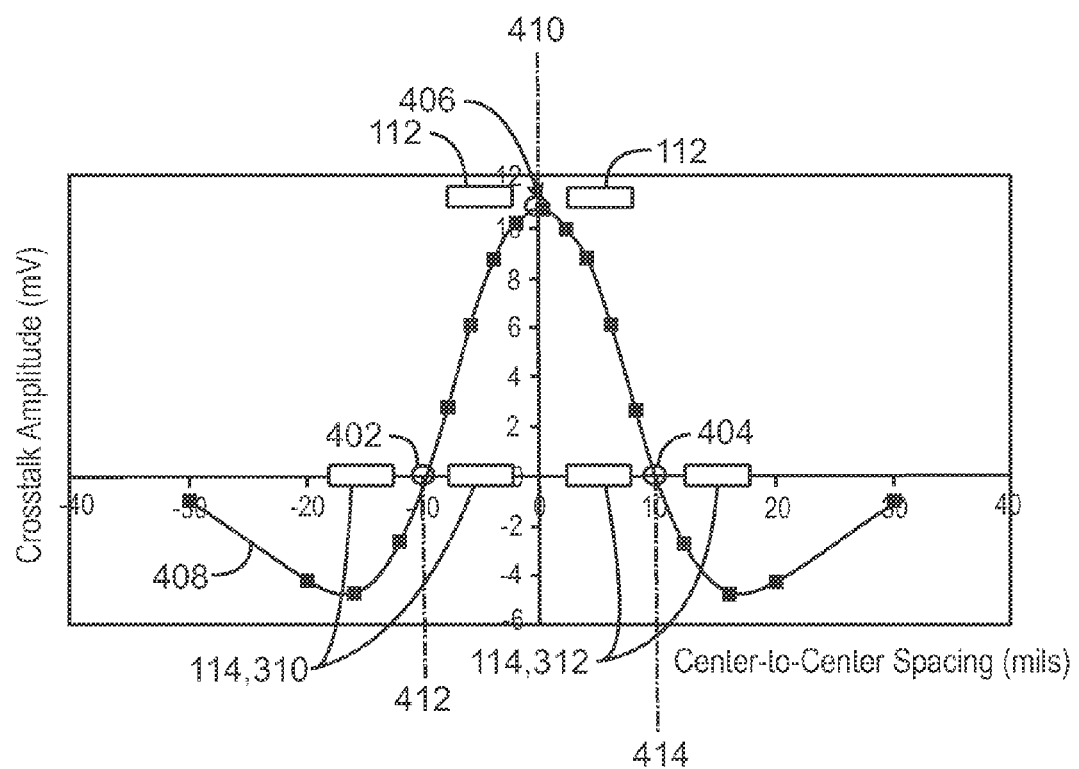
FIG. 4 is a graph illustrating crosstalk amplitude as a measure of displacement spacing between the center lines of the signal lines.

FIG. 3A is a diagram illustrating a top view 300 of two signal line pairs. The signal line pairs may be the signal line pair 112 and the signal line pair 114 of FIG. 1 and FIG. 2. For simplicity, the top view 300 of the signal line pairs 112, 114 is shown without the ground planes 106, 108, and without the dielectric material 120 shown in FIGS. 1 and 2. The top view 300 of the signal lines 112, 114 of FIG. 3A illustrates the geometry of the signal line pairs 112, 114 as they extend lengthwise through the circuit board section, such as the section 102 of FIG. 1.

As discussed above, in reference to FIG. 2, the distance between the center point between each pair of signal lines 112, 114 may be referred to herein as "center-to-center displacement." In FIG. 3A, the center-to-center displacement is indicated by the arrows 302, 303, wherein the dashed line 306 is the centerline extending lengthwise between the signal pairs of the first signal line pair 112. The second signal line pair 114 includes a first segment, indicated by the dashed rectangle 310. The second signal line pair 114 includes a second segment indicated by the dashed rectangles 312. The second signal line pair 114 includes a third segment 314 indicated by the dashed rectangles 314. The third segment 314 couples the first segment 310 to the second segment 312. The dashed line 304 indicates the centerline extending lengthwise between the signal line pairs of the first segment 310 of the second signal line pair 114. The dashed line 308 indicates the centerline extending lengthwise between the signal line pairs of the second segment 312 of the second signal line pair 114. The arrow 302 illustrates the center-to-center displacement of the centerline 304 from the centerline 306. The arrow 303 illustrates the center-to-center displacement of the centerline 308 from the centerline 306.

As illustrated in FIG. 3A, the first segment 310 runs lengthwise parallel to the first signal line pair 112. The second segment 312 runs lengthwise parallel to the first signal line pair. The second segment 312 is displaced from the centerline 306 in a direction that is opposite than the direction of displacement of the first segment 310. Therefore, the second signal line pair 114 receives crosstalk having a first polarity at the first segment 310, and crosstalk having a second polarity that is opposite to the first polarity, at the second segment 312. The combination of the crosstalk having the first polarity with the crosstalk having the second opposite polarity results in a substantial cancellation of the crosstalk. It is appreciated that the crosstalk may be received at the first signal line pair 112 from the second signal line pair 114, and the crosstalk reduction may occur.

The displacement 302 may be referred to herein as a first displacement, and the displacement 303 may be referred herein as a second displacement. In some embodiments, the second displacement 303 is the same displacement as the first displacement 302. In other embodiments, the respective displacements are different, such as when the signal lines 112 and 114 are misaligned due to manufacturing tolerances discussed below in reference to FIG. 7.

Figure 3B:
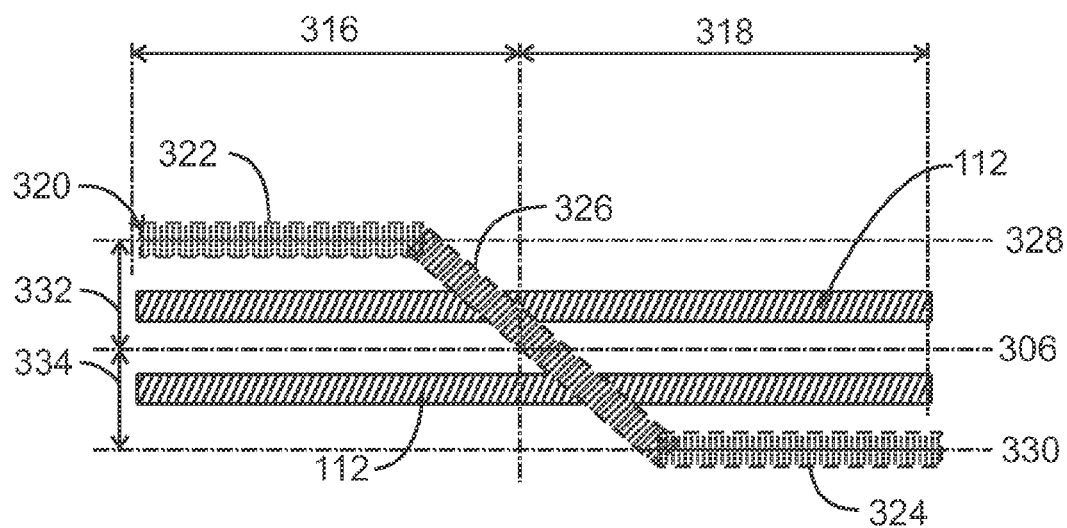
FIG. 3B is a diagram illustrating a top view of the circuit board with one signal line pair and a third signal line being single ended.

FIG. 3B is a diagram 301 illustrating a top view of the circuit board with one signal line pair and a third signal line being single ended. It is appreciated that while FIG. 3A illustrates two pairs of signal lines 112, 114, in some embodiments, one of the signal lines may be unidirectional single-ended signal as long as the other signal line is configured to be a pair differential signal lines, such as the first signal line pair 112 in FIG. 3B. The third signal line 320 may include a first segment, indicated by the dashed rectangle 322. The third signal line 320 includes a second segment indicated by the dashed rectangle 324. The third signal line 320 includes a third segment indicated by the dashed rectangle 326. The third segment 326 couples the first segment 322 to the second segment 324. The dashed line 328 indicates the centerline extending lengthwise along the first segment 322 of the third signal line 320. The dashed line 330 indicates the centerline extending lengthwise along the second segment 324 of the third signal line 320. Arrow 332 illustrates the center-to-center displacement of the centerline 328 from the centerline 306 of the first signal line pair 112. The arrow 334 illustrates the center-to-center displacement of the centerline 330 from the centerline 306. The second segment 324 runs lengthwise parallel to the first signal line pair. The second segment 324 is displaced from the centerline 306 in a direction that is opposite than the direction of displacement of the first segment 322. Therefore, the third signal line 320 receives crosstalk having a first polarity at the first segment 322, and crosstalk having a second polarity that is opposite to the first polarity, at the second segment 324. The combination of the crosstalk having the first polarity with the crosstalk having the second opposite polarity results in a substantial cancellation of the crosstalk. It is appreciated that the crosstalk may be received at the first signal line pair 112 from the third signal line 320, and the crosstalk reduction may occur. When at least one of the signal lines is a differential signal pair, the geometry of the signal lines enables crosstalk reduction because the reduction depends, in part on opposing polarities being transmitted in at least one of the signal lines as differential pairs.

It is also appreciated that while FIG. 3A illustrates only three segments 310, 312, 314 of the second signal line pair 114, additional segments are possible. As illustrated in FIG. 3A, a distance 316 including the first segment 310 and half of the third segment 314, as well as a distance 318 including half of the third segment 314 and the second segment 312, wherein the distance 316 is substantially the same as the distance 318. Similarly illustrated in FIG. 3B, the distance 316 including the first segment 322 and half of the third segment 326, as well as a distance 318 including half of the third segment 326 and the second segment 324, wherein the distance 316 is substantially the same as the distance 318. The substantial similarity of the distances 316, 318 in either FIG. 3A or FIG. 3B enable crosstalk amplitude to be substantially similar yet of opposite polarities. Therefore, in FIG. 3A for example, additional segments of the second signal line pair 114 that traverse the first signal line pair 112 are contemplated as long as additional segments incorporate similar dimensions such as the relative distance 316 to the distance 318.

FIG. 4 is a graph illustrating crosstalk amplitude in millivolts (Mv) as a measure of displacement spacing in (mils) between the centerlines of the signal lines. As discussed above in reference to FIGS. 2 and 3A-3B, the spacing between the centerlines of the signal line pairs enables crosstalk to be reduced. The graph 400 illustrates the amplitude of crosstalk is zero at points 402, 404, and is at a peak amplitude at point 406. The graph of the line 408 shows the change in crosstalk amplitude and polarity as a function of distance from the peak amplitude 406. The peak amplitude 406 occurs at the center point indicated by the dashed line 410 between the first signal line pair 112. The center point 410 coincides with the center line 306 discussed above in relation to FIG. 3A. The center point of the first segment 310 of the second signal line pair 114 is indicated by the dashed line 412. The center point 412 coincides with the center line 304 discussed above in reference to FIG. 3A. The center point of the second segment 312 of the second signal pair 114 is indicated by the dashed line 414. The center point 414 coincides with the center line 308 discussed above in relation to FIG. 3A.

As the relative displacement of the center point 412, 414 of the second signal line pairs 114 increases in relation to the center point 410 of the first signal line pair 112, the crosstalk amplitude decreases until it reaches zero, after which point, the amplitude of the crosstalk becomes a negative value. When the center points 412, 414 of the second signal line pair 114 are disposed at a displacement coinciding with the zero points 402, 404, the crosstalk between the first signal line pair 112 and the second signal line pair 114 is reduced.

Figure 5:
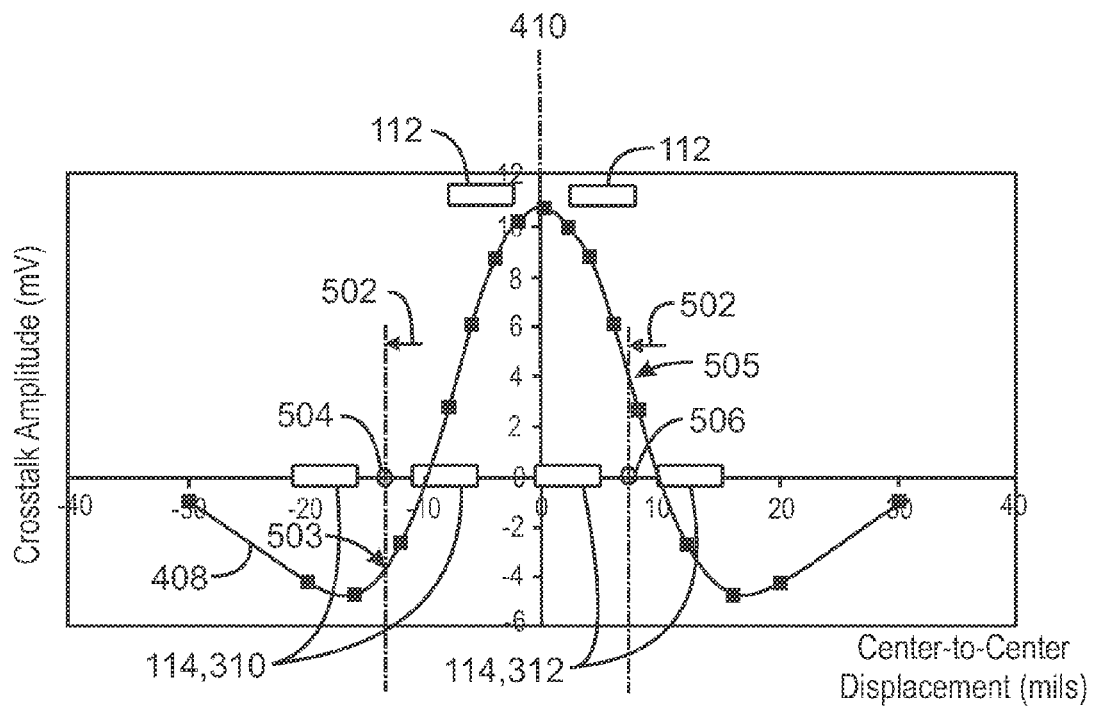
FIG. 5 is a graph illustrating crosstalk amplitude as a measure of spacing displacement between the center lines of the signal lines when the signal lines are misaligned.

FIG. 5 is a graph 500 of the line 408 illustrating crosstalk amplitude in mV as a measure of spacing displacement in mils between the centerlines of the signal lines when the signal lines are misaligned. In some embodiments, the signal lines 112, 114 may be misaligned due to manufacturing tolerances. In this embodiment, the center point 410 is the same center point as illustrated in FIG. 4. The first and second segments 310, 312 of the second signal line pair 114 may reduce crosstalk by being disposed at a displacement from the center point 410 of the first signal line pair 114. In comparison to FIG. 4, the center points of the second signal line pair 114 have been shifted as indicated by the arrows 502. A center point 504 of the first segment 310, and a center point 506 of the second segment 312. Even though the center points 504, 506 of the second signal line pair 114 are not at zero, the amplitude, indicated by the arrows 503, 505, of the crosstalk at each respective center point 504, 506 is equal in magnitude and of an opposite sign. The combination of crosstalk amplitude that is equal but of an opposite sign may reduce or cancel out the crosstalk between the first signal pair 112 and the second signal pair 114.

Figure 6:
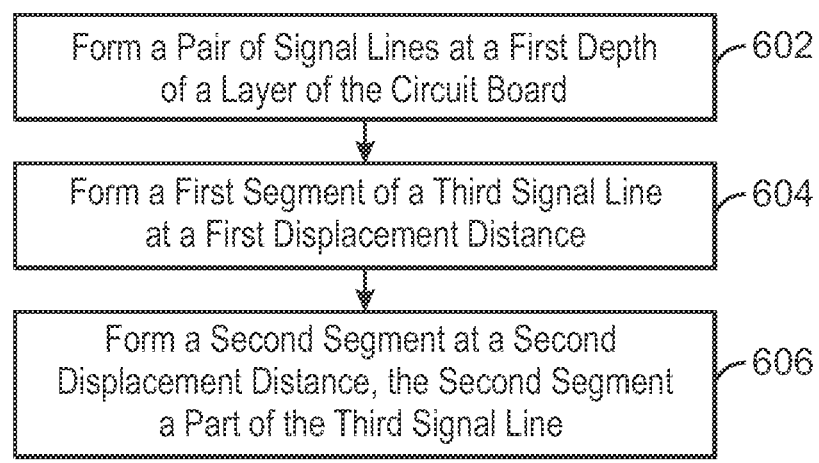
FIG. 6 is a flow diagram illustrating a method of forming signal lines to reduce crosstalk.

FIG. 6 is a flow diagram 600 illustrating a method of forming signal lines to reduce crosstalk. At block 602, a pair of signal lines is formed at a first depth within a section of the circuit board. The pair of signal lines may be configured for differential signaling.

At block 604, a third signal line is formed at a second depth of the circuit board comprising a first segment at a first displacement distance. The first segment of the third signal line formed at block 604 runs parallel to the first signal line at a first displacement distance from the center line. At block 606, a second segment of the third signal line is formed. The second segment runs parallel to the first signal line. The second segment runs on the other side, with respect to the first segment, of the center line. In other words, the first and second segment may be on opposite sides of the centerline of the pair of signal lines formed at block 602. By placing the first and second segments on opposite sides relative to the centerline of the pair of signal lines, crosstalk is reduced as crosstalk received at the first segment may be a first polarity and the crosstalk received at the second segment may be of a second polarity opposite of the first polarity. Thus, the crosstalk received at each of these segments may be significantly reduced.

The method 600 may also include forming (not shown) a third segment of the third signal line. The third segment may couple the first segment and the second segment. Thus, the third segment is disposed at an angle relative to the first segment and to the second segment, respectively.

In some embodiments, the first and second signal lines are both a differential pair of signal lines. The forming at blocks 602, 604, 606 may include forming a differential pair of signal lines for each of the first and second signal lines. In this embodiment, the centerline may be a first centerline, and the second signal line comprises a second center line that extends lengthwise between the pair of signal lines of the second signal line. The first and second displacements may be from the first centerline to the second centerline.

In some embodiments, one of the signal lines is a differential pair and the other signal line is a unidirectional single-ended signal line. In this embodiment, the forming of the signal lines at blocks 602, 604, 606, may include forming a differential pair and a unidirectional single-ended signal line. The first and second displacements are from the centerline of the differential pair to a centerline of the unidirectional single-ended signal line.

In some embodiments, the method 600 may include forming a first reference plane, and forming a second reference plane. The signal lines may be formed between the reference planes within a dielectric. Therefore, the method 600 may include forming a dielectric disposed between the first reference place and the second reference place, wherein the first signal line and the second signal line are disposed within the dielectric.

Example 1

A circuit board is described herein. The circuit board includes a pair of signal lines at a first depth of the circuit board, wherein a center line extends lengthwise between the pair of signal lines. The circuit board includes a third signal line at a second depth of the circuit board, the third signal line comprising a segment that runs parallel to the pair of signal lines at a displacement distance from the center line.

Example 2

A stripline signal system is described herein. The stripline signal system includes a pair of signal lines disposed within a dielectric, the pair of signal lines disposed at a first depth of the dielectric, wherein a center line extends lengthwise between the pair of signal lines. The stripline signal system includes a third signal line disposed within the dielectric, the third signal line comprising a segment running parallel to the pair of signal lines, the segment disposed at a displacement distance relative to the center line.

Example 3

A method of forming signal lines in a circuit board is described herein. The method includes forming a pair of signal lines at a first depth of the circuit board, wherein a center line extends lengthwise between the pair of signal lines. The method includes forming a third signal line at a second depth of the circuit board, the third signal line comprising a segment that runs parallel to the pair of signal lines at a displacement distance from the center line.

Some embodiments may be implemented in one or a combination of hardware, firmware, and software. Some embodiments may also be implemented as instructions stored on the tangible non-transitory machine-readable medium, which may be read and executed by a computing platform to perform the operations described. In addition, a machine-readable medium may include any mechanism for storing or transmitting information in a form readable by a machine, e.g., a computer. For example, a machine-readable medium may include read only memory (ROM); random access memory (RAM); magnetic disk storage media; optical storage media; flash memory devices; or electrical, optical, acoustical or other form of propagated signals, e.g., carrier waves, infrared signals, digital signals, or the interfaces that transmit and/or receive signals, among others.

An embodiment is an implementation or example. Reference in the specification to "an embodiment," "one embodiment," "some embodiments," "various embodiments," or "other embodiments" means that a particular feature, structure, or characteristic described in connection with the embodiments is included in at least some embodiments, but not necessarily all embodiments, of the present techniques. The various appearances of "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

It is to be noted that, although some embodiments have been described in reference to particular implementations, other implementations are possible according to some embodiments. Additionally, the arrangement and/or order of circuit elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

It is to be understood that specifics in the aforementioned examples may be used anywhere in one or more embodiments. For instance, all optional features of the computing device described above may also be implemented with respect to either of the methods or the computer-readable medium described herein. Furthermore, although flow diagrams and/or state diagrams may have been used herein to describe embodiments, the techniques are not limited to those diagrams or to corresponding descriptions herein. For example, flow need not move through each illustrated box or state or in exactly the same order as illustrated and described herein.

The present techniques are not restricted to the particular details listed herein. Indeed, those skilled in the art having the benefit of this disclosure will appreciate that many other variations from the foregoing description and drawings may be made within the scope of the present techniques. Accordingly, it is the following claims including any amendments thereto that define the scope of the present techniques.

What is claimed is:

1. A circuit board, comprising:
   a pair of signal lines at a first depth of the circuit board, wherein a center line extends lengthwise between the pair of signal lines; and
   a third signal line at a second depth of the circuit board, the third signal line comprising a first segment that runs parallel to the pair of signal lines at a first displacement distance relative to one side of the center line, the third signal line further comprising a second segment coupled to the first segment that runs parallel to the pair of signal lines on the other side of the center line at a second displacement distance relative to the centerline.

2. The circuit board of claim 1, wherein the first segment is equal in length to the second segment.

3. The circuit board of claim 1, wherein the pair of signal lines and the third signal line are disposed within the circuit board comprising:
   a first reference plane;
   a second reference plane; and
   a dielectric disposed between the first reference plane and the second reference plane, wherein the pair of signal lines and the third signal line are disposed within the dielectric.

4. The circuit board of claim 1, further comprising a fourth signal line at the second depth, wherein the third signal line and the fourth signal line form a second pair of signal lines to communicate differential signals.

5. The circuit board of claim 4, wherein the center line of the pair of signal lines is a first center line, and wherein a second center line extends lengthwise between the second pair of signal lines, and wherein the first and second displacement distances are from the first center line of the first signal line pair to the second center line of the second signal line pair.

6. The circuit board of claim 1, wherein the first displacement distance and the second displacement distance are approximately equal.

7. The circuit board of claim 1, wherein crosstalk is reduced between the pair of signal lines and the third signal line due to an opposite polarity of crosstalk received on the first segment with respect to a polarity of crosstalk received on the second segment.

8. The circuit board of claim 1, wherein the pair of signal lines is to communicate a differential signal and the third signal line is to communicate a single-ended signal.

9. A stripline signal system, comprising:
   a pair of signal lines disposed within a dielectric, the pair of signal lines disposed at a first depth of the dielectric, wherein a center line extends lengthwise between the pair of signal lines; and
   a third signal line disposed within the dielectric, the third signal line comprising a first segment running parallel to the signal line pair at a first displacement distance relative to the center line, the third signal line further comprising a second segment that is coupled to the first segment and running parallel to the pair of signal lines, the second segment disposed at a second displacement distance relative to the center line in a direction opposite to the first displacement distance.

10. The stripline signal system of claim 9, wherein the first segment is equal in length to the second segment.

11. The stripline signal system of claim 9, wherein the dielectric is a part of a circuit board, the circuit board comprising:

a first reference plane; and a second reference plane, wherein the dielectric is disposed between the first reference plane and the second reference plane.

12. The stripline signal system of claim 9, further comprising a fourth signal line at the first depth, wherein the third signal line and the fourth signal line form a second pair of signal lines to communicate differential signals.

13. The stripline signal system of claim 12, wherein the center line of the first signal line is a first center line, and wherein a second center line extends lengthwise between the second pair of signal lines, and wherein the first and second displacement distances are from the first center line of the first signal line pair to the second center line of the second signal line pair.

14. The stripline signal system of claim 9, wherein the first displacement distance and the second displacement distance are approximately equal.

15. The stripline signal system of claim 9, wherein crosstalk is reduced between the pair of signal lines and the third signal line due to an opposite polarity of crosstalk received on the first segment with respect to a polarity of crosstalk received on the second segment.

16. The stripline signal system of claim 9, further comprising a third segment propagating at an angle relative to the first segment, wherein the third segment couples the first segment and the second segment.

17. The stripline signal system of claim 16, wherein the first segment and approximately one half of the third segment is equal in length to the second segment and approximately the other half of the third segment.

18. The stripline signal system of claim 9, wherein the pair of signal lines is to communicate a differential signal and the third signal line is to communicate a single-ended signal.

19. A method of forming signal lines in a circuit board, comprising:

forming a pair of signal lines at a first depth of the circuit board, wherein a center line extends lengthwise between the pair of signal lines; and forming a third signal line at a second depth of the circuit board, the third signal line comprising a first segment that runs parallel to the pair of signal lines at a first displacement distance relative to one side of the center line, wherein forming the third signal line further comprises forming a second segment coupled to the first segment and that runs parallel to the pair of signal lines on the other side of the center line at a second displacement distance.

20. The method of claim 19, wherein the first segment is equal in length to the second segment.

21. The method of claim 19, further comprising forming a fourth signal line at the second depth, wherein the third signal line and the fourth signal line form a second pair of signal lines to communicate differential signals.

22. The method of claim 21, wherein the center line of the first pair of signal lines is a first center line, and wherein a second center line extends lengthwise between the second pair of signal lines, and wherein the first and second displacement distances are from the first center line to the second center line.

23. The method of claim 19, wherein the pair of signal lines and the third signal line are disposed within a section of the circuit board, comprising:

forming a first reference plane of the circuit board;

forming a second reference plane of the circuit board; and forming a dielectric disposed between the first reference plane and the second reference plane, wherein the pair of signal lines and the third signal line are disposed within the dielectric.

24. The method of claim 19, further comprising forming a third segment of the third signal line, the third segment disposed at an angle relative to the first segment, wherein the third segment couples the first segment and the second segment.

25. The method of claim 19, wherein the pair of signal lines is configured to communicate a differential signal and the third signal line is to communicate a single-ended signal.

\* \* \* \* \*